United States Patent [19]
Juskey et al.

[11] Patent Number: 5,153,385
[45] Date of Patent: Oct. 6, 1992

[54] TRANSFER MOLDED SEMICONDUCTOR PACKAGE WITH IMPROVED ADHESION

[75] Inventors: Frank J. Juskey; Lonnie L. Bernardoni, both of Coral Springs; Thomas J. Swirbel, Davie; Barry M. Miles, Plantation, all of Fla.

[73] Assignee: Motorola, Inc., Schaumburg, Ill.

[21] Appl. No.: 670,648

[22] Filed: Mar. 18, 1991

[51] Int. Cl.$^5$ .............................................. H05K 1/00
[52] U.S. Cl. .................................. 174/260; 361/402; 174/256; 428/901
[58] Field of Search .................. 174/52.2, 52.4, 256, 174/258, 259, 260; 361/400, 402, 411; 428/76, 473.5, 901; 427/96, 98, 34; 204/192.34, 192.1, 192.36; 354/72, 80

[56] References Cited

U.S. PATENT DOCUMENTS

| | | | |
|---|---|---|---|
| 4,064,030 | 12/1977 | Nakai | 204/192.36 |
| 4,230,754 | 10/1980 | Maher | 428/76 |
| 4,736,012 | 4/1988 | Shoji et al. | 528/188 |
| 4,826,720 | 5/1989 | Wade | 428/473.5 |
| 4,973,645 | 11/1990 | Lee | 528/38 |
| 4,974,057 | 11/1990 | Tazima | 357/72 |
| 4,999,699 | 3/1991 | Christie et al. | 357/65 |

Primary Examiner—Leo P. Picard
Assistant Examiner—Trinidad Korka
Attorney, Agent, or Firm—Dale W. Dorinski; Daniel K. Nichols

[57] ABSTRACT

A transfer molded pad array chip carrier is formed by mounting and wirebonding a semiconductor device (12) on a printed circuit board (10). The bottom side of the printed circuit board may have an array of solderable surfaces (24). A polymer coating (18) is applied over the semiconductor device (12), the wirebonds (16), and the top side of the printed circuit board (10) and cured. The coating (18) is then sputter etched in a partial vacuum to enhance the adhesion of the transfer molding compound (20) to the printed circuit board (10). The semiconductor device is encapsulated by a transfer molding process. The polymer coating (18) also provides a barrier to alpha particle emission, improves the moisture resistance of the completed package and reduces stress at the surface of the device.

15 Claims, 2 Drawing Sheets

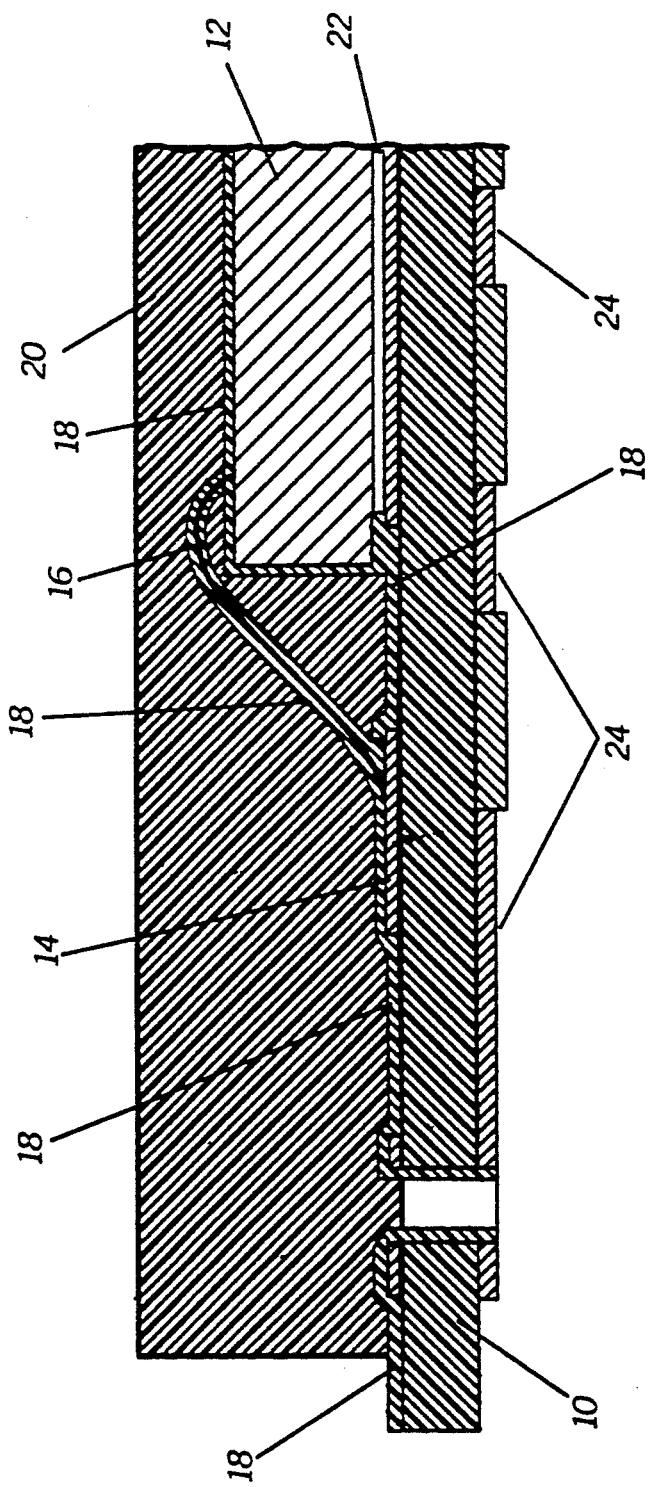

TRANSFER MOLDED SEMICONDUCTOR PACKAGE WITH IMPROVED ADHESION

TECHNICAL FIELD

This invention relates generally to packages for semiconductor devices, and particularly to transfer molded leadless semiconductor packages.

BACKGROUND

Transfer molded semiconductor packages have become a popular form of integrated circuit packaging. Transfer molded pad grid array packages are the most recent development in attempts to reduce size and cost, while achieving ever increasing levels of performance. A transfer molded pad grid array package is a surface mount device using solder pads to provide the electrical connections. An array of pads having a standard spacing (for example, 100 mils center to center) is located on one face of a printed circuit substrate made from glass reinforced materials such as epoxy, polyimide or polyester. An integrated circuit or semiconductor device is mounted on the top side of the substrate and wire bonds are made between the bonding pads of the integrated circuit and the traces on the substrate. The integrated circuit, the leads, and the wire bonds are then completely covered with a thermoset plastic encapsulant to form the package. The encapsulant resin is molded over the integrated circuit chip so as to surround it, the bonding wires, and portions of the substrate. Because the encapsulant resin is molded onto only the upper surface of the substrate, adhesion between the resin and the substrate is extremely important, as there is no provision for mechanical adhesion as in other packages where the resin surrounds the substrate on at least 5 sides.

In transfer molding, the assembly to be encapsulated is located inside a metal mold which has recesses defining the shape of the cover to be produced. Solid plastic is heated and forced under pressure through gates into the mold. The heat and pressure causes the plastic to liquify and flow into the mold cavities surrounding the integrated circuit. The mold is heated to cure the plastic and the molded assembly is then removed from the mold. The basic characteristics of transfer molding are taught in U.S. Pat. No. 4,460,537, and a transfer-molded plastic pin grid array package is taught in U.S. Pat. No. 4,935,581.

Alpha particle induced errors in semiconductor devices were recorded for the first time in 1978. These errors, known as soft errors, are defined as a random, non-reoccurring change in the information stored within a memory cell caused by the passage of an alpha particle through an active device region. Alpha particles originate from residual radioactivity of uranium present as trace impurities in the raw materials used to make the transfer molding compound of the plastic package. The main source of radiation in plastic packages comes from the fillers in the molding compound. The most straightforward solution to eliminating soft errors would be to remove all traces of radioactivity from the molding compound resin. Although this is acceptable in principle, the cost is prohibitive for nearly all applications and some residual activity can still be a problem. Error correction algorithms have been incorporated in some large memory devices to counter soft error problems. However, the extension of this technology to smaller scale circuits is difficult and expensive, leaving a need for a solution to alpha particle emission and soft error problems.

Another problem in transfer molded pad grid array packages is transmission of moisture at the molding compound substrate interface into the center of the package, causing corrosion of the semiconductor and electrical interconnections and degradation of the epoxy die attach adhesive. Previous solutions have extended the molding compound around the edges of the substrate to reduce or eliminate the substrate/molding compound interface problem. However, in pad grid array packages, this is not possible and another method needs to be found to reduce moisture transmission along this interface.

Still another problem with transfer molded packages is the stress induced during the molding operation. The thermal-expansion-coefficient mismatch between the molding compound and the semiconductor device is so large that in some instances cracking of the glass passivation and actual movement of the aluminum conductors on the surface of the device occurs. Buffer coats are sometimes applied to the semiconductor device to alleviate this stress buildup, but this application is performed at the wafer level, and the die bond pads must be protected and then uncovered. This is a costly process, and results in yield loss of the die. In addition, buffer coating at the wafer level precludes back lapping, which is often used to reduce the thickness of the die.

The advantages of a plastic pad grid array are low cost and smaller size. However, despite these advantages, other concerns such as molding compound adhesion, soft errors due to alpha particles, buffer coating cost, the ability to back lap, and moisture resistance remain in pad grid array packages. Clearly, a need exists for a low-cost, plastic package that would overcome these inherent problems.

SUMMARY OF THE INVENTION

Briefly, according to the invention, a transfer molded semiconductor package is formed by mounting a semiconductor device on a printed circuit board. The bottom side of the printed circuit board has an array of solder pads. A polymer coating is applied over the semiconductor device, the wirebonds, and the top side of the printed circuit board and cured. The coating is then sputter etched in a partial vacuum to enhance the adhesion of the transfer molding compound to the printed circuit board. The semiconductor device is encapsulated by a transfer molding process.

BRIEF DESCRIPTION OF THE DRAWINGS

FIG. 2 is a cross sectional view of the transfer molded semiconductor device of FIG. 1 through section 2—2.

DETAILED DESCRIPTION OF THE PREFERRED EMBODIMENT

Figure 1:
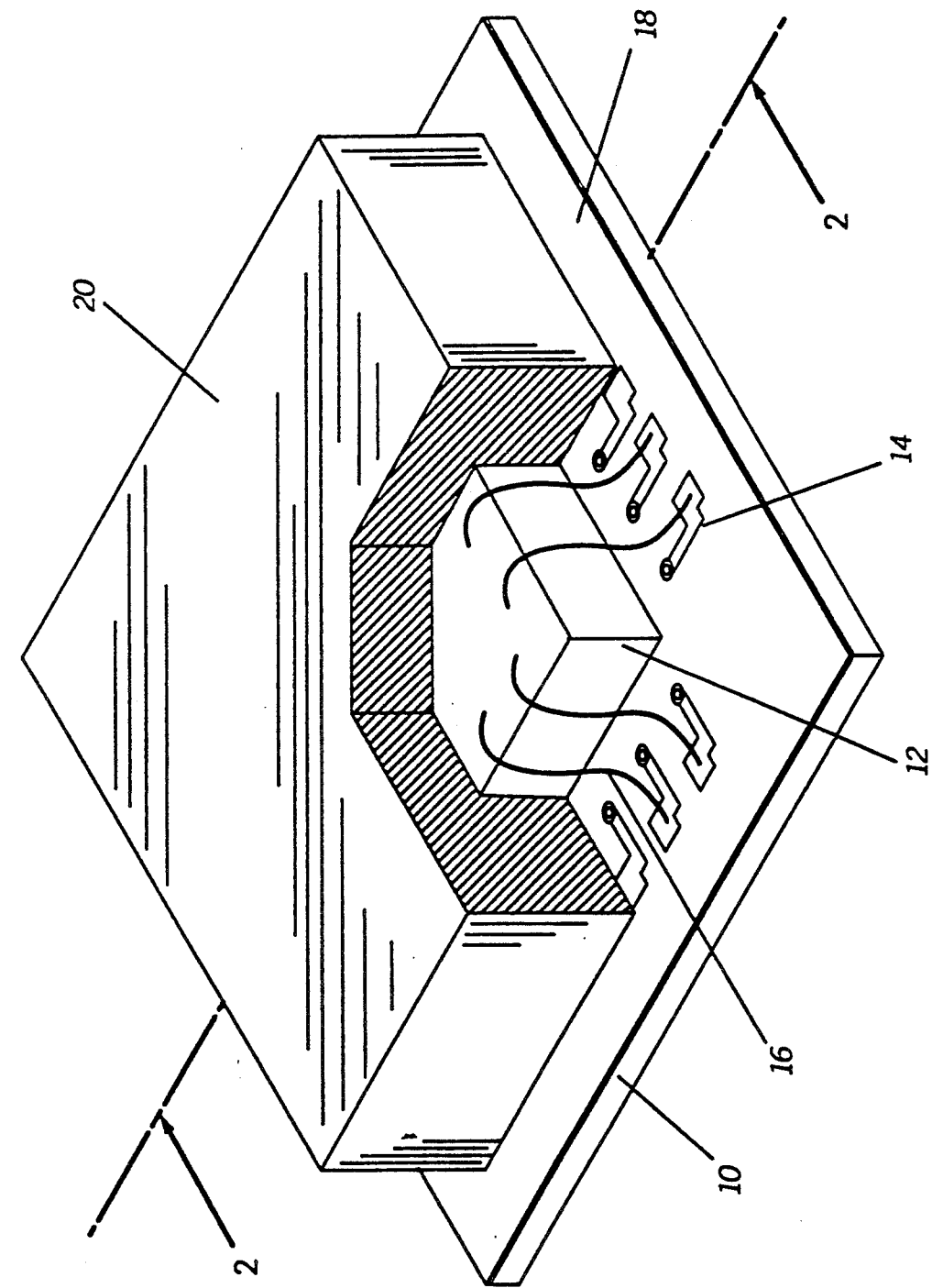
FIG. 1 is an isometric cut-away view of a transfer molded semiconductor device in accordance with the present invention.

Referring to FIG. 1, a printed circuit board or circuit carrying substrate 10 is formed with a metalization pattern 14 consisting of runners and wirebond pads. The printed circuit board 10 may be a glass reinforced laminate such as epoxy, polyimide, modified epoxy or polyester resin. A semiconductor device 12 is mounted on the printed circuit board 10. Typically, the semiconductor device 12 is attached to the printed circuit board by means of an epoxy adhesive filled with silver. The electrical interconnection of the individual circuitry of the semiconductor device 12 is made to the printed circuit board 10 by means of wirebonds 16. After electrical interconnections have been made, the assembly is then coated with a polymer resin 18 such as a polyimide resin. Polyimide 18 is typically sprayed over the entire assembly and coats all exposed surfaces of the printed circuit board 10, the semiconductor device 12 and the wirebonds 16. A preferred method of applying the polyimide coating is by spraying. Examples of suitable polyimides which have been found to provide a uniform alpha particle barrier are made from, for example, benzophenone tetracarboxylic acid dianhydride and oxydianiline. These type resins are available, for example, from the DuPont Company of Wilmington, Delaware, under the trade names PYRALIN®2550, PYRALIN®2750, or PYRALIN®2610. Other equivalent materials such as 337, 348 and 408 may be obtained from Ciba-Geigy. Each of these materials is applied with the solids content ranging between about ten and about fifteen percent. One or more coatings of the polymer is sprayed over the assembly in order to provide a uniform coating without pinholes. The finished thickness of the coating may vary from 0.1 mil to approximately 2 mils depending upon the material selected and the coating thickness desired. The coating 18 is then cured by heating through a series of successive steps up to a final temperature of 300° C. held for a minimum of thirty minutes. After removing the solvents from the material and curing, the assembly is placed in a vacuum chamber and sputter-etched in an argon/oxygen atmosphere. Working pressures for the sputter etching process are: argon pressures of 0.1 to $9.9 \times 10-3$ mbar at 500 to 1000 watts for one to three minutes followed by an oxygen pressure of 0.1 to $9.9 \times 10-2$ mbar at 500 to 1000 watts two to four minutes. This type of sputter-etched treatment is believed to roughen the surface and provide increased adhesion between the molding compound and the polyimide. The assembly now contains a polymer coating 18 which serves as a moisture passivation barrier and an alpha particle barrier to the surface of the semiconductor device 16. The assembly is then placed in a transfer molding machine and a transfer molded cover 20 is molded about the semiconductor device, wirebonds and the top surface of the substrate 10.

Referring now to FIG. 2, it can be seen that a uniform coating of the polyimide 18 is applied over all exposed surfaces of the semiconductor device and the wirebonds. This serves to provide an alpha particle barrier between the fillers in the molding compound 20 and the surface of the semiconductor device 12 and also provides a moisture passivation barrier to prevent intrusion of moisture to the silver-filed epoxy die attach material 22. The uniform coating of polyimide on the surface of the printed circuit board 10 also provides improved adhesion of the molding compound 20 to the printed circuit board 10.

On the bottom of the substrate 10 is a plurality of solderable surfaces 24. The solderable surfaces 24 are typically pads delineated in a metal layer formed in the substrate 10. The solderable surfaces 24 may also be further treated so as to contain solder bumps.

In order to evaluate the efficacy of the polyimide coating, the adhesion of the molding compound to various substrates was measured using an Instron tensile tester. When transfer molding compound was applied to a bare printed circuit board, the tensile adhesion to the printed circuit board was found to be approximately 200 psi. When the printed circuit board was coated with polyimide but not sputter etched, tensile adhesion was found to be approximately 180 psi. Sputter etching the polyimide coating prior to transfer molding improved the tensile adhesion strength significantly, such that the measured tensile adhesion was approximately 590 psi. The failure mechanism of the coated and etched substrate was found to be cohesive failure of the substrate as opposed to adhesive failure of the molding compound/substrate interface.

As a result, the use of a sputter etched polyimide buffer coat applied over the semiconductor device, wirebonds and the substrate prior to transfer molding provides several advantages: 1) improved adhesion of the molding compound to the substrate, 2) reduced stress between the surface of the die and the molding compound, thereby increasing the reliability of the package, 3) improved resistance to moisture susceptibility of the silver-filled epoxy die attached adhesive, 4) improved soft error failures due to alpha particle emissions, 5) it allows for back lapping of the die to reduce die thickness and improve thermal transfer, and 6) it lowers the cost of processing because there is no yield losses at the wafer layer due to photo-imaging the buffer coat.

What is claimed is:

1. A transfer molded leadless semiconductor package, comprising:
 a printed circuit board having upper and lower opposed surfaces, the lower surface having a plurality of solderable pads;
 a semiconductor device electrically and mechanically attached to the upper surface of the printed circuit board, and electrically connected to the plurality of pads via the circuit board;
 a polymer coating over the semiconductor device and at least a portion of the upper surface of the printed circuit board, said polymer coating having a roughened surface; and
 molding compound formed about the semiconductor device so as to encapsulate the semiconductor device and at least a portion of the upper surface of the printed circuit board, the molding compound being in direct contact with said roughened surface of said polymer coating and formed so as to completely reveal the lower surface of the printed circuit board.

2. The package of claim 1, wherein the polymer coating comprises a polyimide.

3. The package of claim 2, wherein the roughened surface of the polymer coating is formed by sputter etching the polymer coating.

4. The package of claim 1, wherein the semiconductor package comprises a chip carrier.

5. The package of claim 4, wherein the semiconductor package comprises a pad grid array chip carrier.

6. The package of claim 1, wherein the polymer coating comprises a coating having a thickness between about 0.0005 inches and 0.0015 inches.

7. The package of claim 1, wherein the printed circuit board comprises a flexible film.

8. A transfer molded leadless chip carrier, comprising:
 a printed circuit board having upper and lower opposed surfaces;
 a semiconductor device electrically and mechanically attached to the upper surface of the printed circuit board;

a polyimide coating over the semiconductor device and portions of the upper surface of the printed circuit board; and a plastic molding compound formed about the semiconductor device so as to totally encapsulate the device, the molding compound covering substantially all of the upper surface of the board and being in direct contact with said polyimide coating and formed so as to completely reveal the lower surface of the printed circuit board.

9. The chip carrier of claim 8, wherein the chip carrier comprises a pad grid array chip carrier, said lower surface having an array of solderable pads.

10. The chip carrier of claim 8, wherein the polymer coating comprises a coating having a thickness between about 0.0005 inches and 0.0015 inches.

11. A method of making a transfer molded semiconductor package, comprising the steps in the order named of:

providing a printed circuit board having opposed sides;

providing a semiconductor device;

electrically and mechanically mounting the semiconductor device on a first side of the printed circuit board to form an assembly;

coating the assembly with a polymer coating;

sputter etching the coating; and transfer molding a plastic material about the semiconductor device and substantially all of the first side of the printed circuit board so as to completely reveal an opposed second side of the printed circuit board.

12. The method as described in claim 11, wherein the step of coating the assembly comprises coating the assembly with a polyimide coating.

13. The method as described in claim 11, wherein the step of molding a plastic material comprises injection molding.

14. The method as described in claim 11, further comprising a final step of providing solder bumps on the second side of the printed circuit board.

15. The chip carrier of claim 8, wherein the plastic molding compound is formed about the semiconductor device so as to totally encapsulate the device, the molding compound formed on the upper surface of the printed circuit board so as to reveal the entire lower surface of the printed circuit board and a portion of the upper surface of the printed circuit board about a perimeter of the molding compound.

* * * * *